US010658617B2

(12) United States Patent
Kajiyama (10) Patent No.: US 10,658,617 B2
(45) Date of Patent: *May 19, 2020

(54) DISPLAY DEVICE

(71) Applicant: Japan Display Inc., Tokyo (JP)

(72) Inventor: Kenta Kajiyama, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/433,249

(22) Filed: Jun. 6, 2019

(65) Prior Publication Data

US 2019/0288238 A1 Sep. 19, 2019

Related U.S. Application Data

(63) Continuation of application No. 15/718,022, filed on Sep. 28, 2017, now Pat. No. 10,361,395.

(30) Foreign Application Priority Data

Oct. 14, 2016 (JP) .................................. 2016-202463

(51) Int. Cl.
*H01L 51/52* (2006.01)
*H01L 27/32* (2006.01)
(Continued)

(52) U.S. Cl.
CPC ....... *H01L 51/5253* (2013.01); *G09G 3/3233* (2013.01); *H01L 27/3276* (2013.01);
(Continued)

(58) Field of Classification Search
CPC ......... H01L 2251/5338; H01L 27/3276; H01L 51/0097; H01L 51/5253; H01L 51/5259;
(Continued)

(56) References Cited

U.S. PATENT DOCUMENTS

2010/0277448 A1  11/2010  Okamoto et al.
2011/0007042 A1*  1/2011  Miyaguchi .............. G02F 1/167
345/204
(Continued)

FOREIGN PATENT DOCUMENTS

CN      202549191 U    11/2012
JP      2010-256660 A  11/2010
(Continued)

OTHER PUBLICATIONS

Korean Office Action dated Sep. 17, 2018 for the corresponding Korean patent application No. 10-2017-0125845, with partial English translation.
(Continued)

*Primary Examiner* — Matthew C Landau
*Assistant Examiner* — Priya M Rampersaud
(74) *Attorney, Agent, or Firm* — Michael Best & Friedrich LLP (57) ABSTRACT

A display device in an embodiment according to the present invention includes a substrate including a first surface and a second surface opposing the first surface, a display area on the first surface of the substrate and including a plurality of pixels, a periphery area on an outer side of the display area of the first surface, and a sealing layer covering the display area and the periphery area. The periphery area includes a drive circuit outputting a signal to the display area, an input terminal part input with a signal for driving the drive circuit, and a plurality of wirings arranged between the drive circuit and the input terminal part, and the sealing layer includes at least one opening part exposing the first surface of the substrate in an area inside a corner part of the substrate in the periphery area.

18 Claims, 8 Drawing Sheets

(51) Int. Cl.
*G09G 3/3233* (2016.01)
*H01L 51/00* (2006.01)

(52) U.S. Cl.
CPC ............ *G09G 2300/0842* (2013.01); *G09G 2310/0281* (2013.01); *G09G 2380/02* (2013.01); *H01L 51/0097* (2013.01); *H01L 2251/5338* (2013.01)

(58) Field of Classification Search
CPC ............ H01L 51/5281; H01L 23/4985; H01L 41/0475; H01L 27/3244; H01L 51/5246; G09G 2310/0281; G09G 2380/02; H05K 3/361
See application file for complete search history.

(56) References Cited

U.S. PATENT DOCUMENTS

| | | | |
|---|---|---|---|
| 2012/0146886 A1 | 6/2012 | Minami et al. | |
| 2012/0218219 A1* | 8/2012 | Rappoport | H01L 27/3276 345/174 |
| 2014/0254111 A1 | 9/2014 | Yamazaki et al. | |
| 2015/0036299 A1* | 2/2015 | Namkung | G02F 1/133345 361/749 |
| 2016/0204373 A1 | 7/2016 | Park | |

FOREIGN PATENT DOCUMENTS

| | | |
|---|---|---|
| JP | 2010-282183 A | 12/2010 |
| JP | 2011-034066 A | 2/2011 |
| JP | 2011-209405 A | 10/2011 |
| JP | 2012-128006 A | 7/2012 |
| JP | 2014-197181 A | 10/2014 |
| KR | 10-2012-0098471 A | 9/2012 |
| KR | 10-2016-0082189 A | 7/2016 |
| KR | 10-2016-0087982 A | 7/2016 |

OTHER PUBLICATIONS

Taiwan Office Action dated Oct. 30, 2018 for the corresponding Taiwan patent application No. 106128020, with partial English translation.
Chinese Office Action dated Aug. 16, 2019 for the corresponding Chinese patent application No. 201710914208.8, with Partial English translation.

* cited by examiner

DISPLAY DEVICE

CROSS REFERENCE TO RELATED APPLICATIONS

This application is a continuation application based on U.S. patent application Ser. No. 15/718,022, filed on Sep. 28, 2017. Further, this application is based upon and claims the benefit of priority from the prior Japanese Patent Application No. 2016-202463, filed on Oct. 14, 2016, the entire contents of which are incorporated herein by reference.

FIELD

One embodiment of the present invention is related to a display device using a flexible substrate.

BACKGROUND

An information terminal device (also called a smartphone) having both a calling function and a computer function as an example of an electronic device having a display is spreading to consumers. Such an electronic device has an appearance in which a display is arranged on one surface of a main body and the size of the screen occupying the casing strongly influences an impression given to the appearance. The tendency of the design in such an electronic device is that the area where the display is exposed on the front surface of the main body is increased, a periphery area in which the casing surrounds the display (also called a "frame area") is narrowed, and a smart appearance is sometimes formed. Narrowing the periphery area of the display to make it slimmer is sometimes referred to as "narrowing of a frame" of a display panel.

A display panel is divided into a display area where pixels are arranged and a periphery area where a drive circuit and an input terminal are arranged. Narrowing of a frame of the display panel is for reducing the area of the periphery area. Therefore, a technique in which narrowing of the frame by bending an area where the driving circuit and the input terminal are arranged is disclosed. For example, a display device in which a stainless-steel substrate or a plastic substrate having flexibility is used and the substrate is curved at an outer part of a display area is disclosed (for example, see Japanese Laid Open Patent Application No. 2011-209405, Japanese Laid Open Patent Application No. 2012-128006, Japanese Laid Open Patent Application No. 2011-034066, Japanese Laid Open Patent Application No. 2014-197181). In addition, a flexible display panel in which the thickness of a part of the substrate at which the substrate is curved is reduced to make it easier to bend is disclosed (for example, see Japanese Laid Open Patent Application No. 2010-256660 and Japanese Laid Open Patent Application No. 2010-282183).

However, when attempting to bend four sides of a display panel, a problem arises wherein cutting of wiring and damage of a sealing film (occurrence of cracks, peeling and the like) occur at places where the folds overlap.

SUMMARY

A display device in an embodiment according to the present invention includes a substrate including a first surface and a second surface opposing the first surface, a display area on the first surface of the substrate and including a plurality of pixels, a periphery area on an outer side of the display area of the first surface, and a sealing layer covering the display area and the periphery area. The periphery area includes a drive circuit outputting a signal to the display area, an input terminal part input with a signal for driving the drive circuit, and a plurality of wirings arranged between the drive circuit and the input terminal part, and the sealing layer includes at least one opening part exposing the first surface of the substrate in an area inside a corner part of the substrate in the periphery area.

A display device in an embodiment according to the present invention includes a substrate having flexibility and including a first surface and a second surface opposing the first surface, a display area on the first surface of the substrate and including a plurality of pixels, a periphery area on an outer side of the display are of the first surface, and an insulating layer spreading to the display area and the periphery area. The periphery area includes a drive circuit outputting a signal to the display area, an input terminal part input with a signal for driving the drive circuit, and a plurality of wirings arranged between the drive circuit and the input terminal part, the substrate includes a first curved part along a first side of the substrate and a second curved part along a second side intersecting the first side of the substrate, the first curved part and the second curved part are arranged inside an edge part of the substrate, and the insulating layer includes an opening part exposing the first surface of the substrate in an area where the first curved part and the second curved part intersect.

DESCRIPTION OF EMBODIMENTS

The embodiments of the present invention are explained below while referring to the diagrams. However, it is possible to perform the present invention using many different forms, and the present invention should not be limited to the content described in the embodiments exemplified herein. In addition, although the width, thickness and shape of each component are shown schematically compared to their actual form in order to better clarify explanation, the drawings are merely an example and should not limit an interpretation of the present invention. Furthermore, in the specification and each drawing, the same reference symbols (or symbols attached with a, b and the like after numbers) are attached to similar elements and elements that have been mentioned in previous drawings, and therefore a detailed explanation may be omitted where appropriate. Furthermore, characters denoted by [first], [second] with respect to each element are appropriate marks used to distinguish each element and unless otherwise explained do not include any further meaning.

In this specification, when certain components or regions are described as being "above" or "below" other components or regions, as long as there are no limitations, it does not necessarily mean they are directly above or below. This description includes cases in which a component or region is located higher or lower than another component or region. In other words, other components or regions are located between the component or region being described and the component or region above or below. Further, in the description below, unless otherwise noted, in a cross-sectional view, the side on which the second substrate is located with respect to the substrate will be described as "above" and the other side will be described as "below."

First Embodiment

Figure 1:
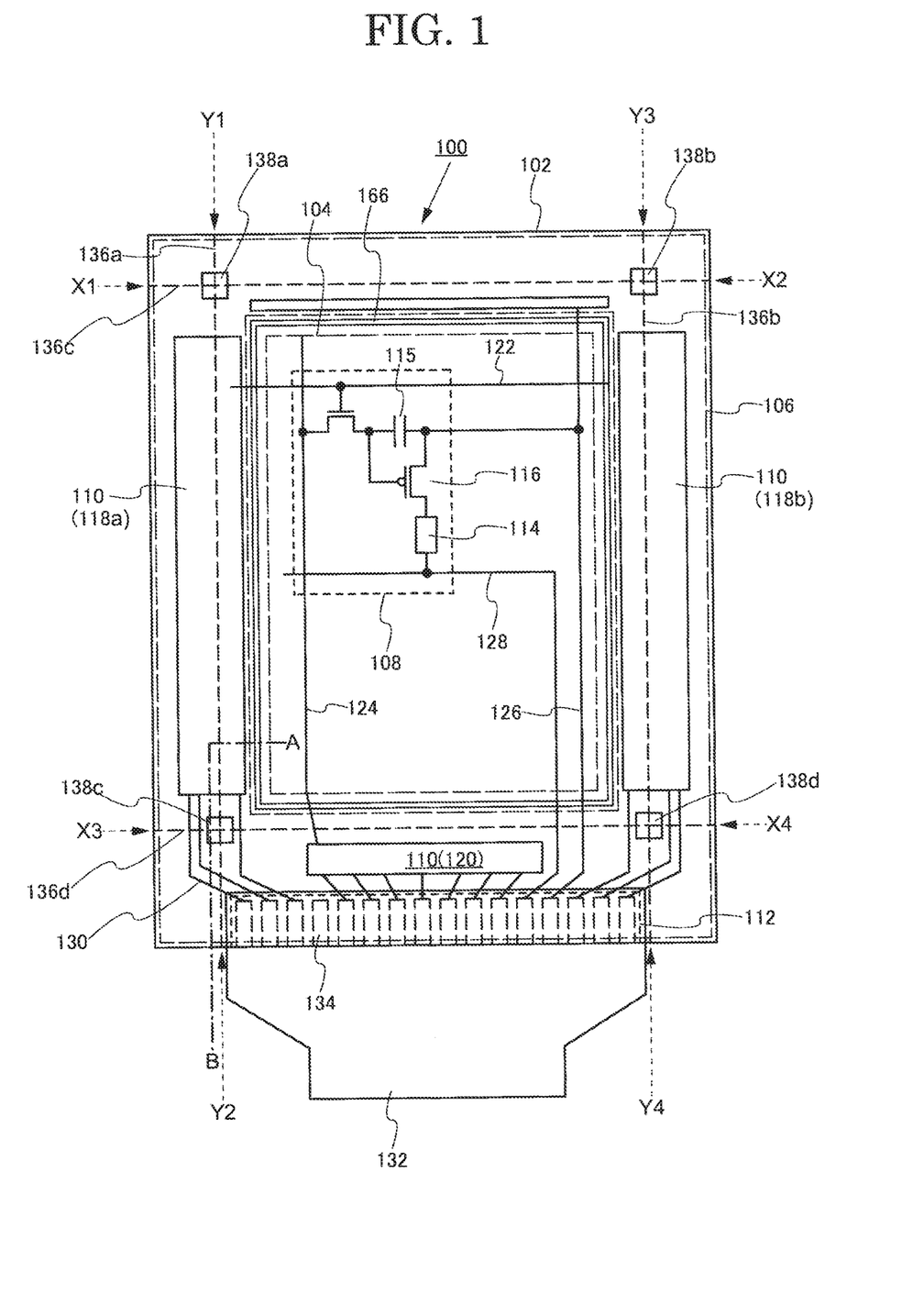
FIG. 1 is a planar view diagram showing a structure of a display device related to the present embodiment.

FIG. 1 is a planar view diagram showing a structure of a display device 100 related to the present embodiment. The display device 100 is arranged with a display area 104 in which pixels 108 are arranged on a substrate 102. The display device 100 includes a periphery area 106 in which a driving circuit part 110 and an input terminal part 112 are arranged in an area outside the display area 104. The substrate 102 has a first surface and a second surface opposing the first surface. For example, the display area 104 and the periphery area 106 are arranged on the first surface of the substrate 102.

A pixel 108 includes a light emitting element 114, a transistor 116 connected to the light emitting element 114, and a first capacitor element 115 connected to the transistor 116 and the like. The drive circuit part 110 includes first drive circuits 118a and 118b which output a scanning signal to a scanning signal line 122 and a second drive circuit 120 which outputs a video signal to a video signal line 124. Each circuit included in the drive circuit part 110 is formed including a transistor the same as the pixel 108. The input terminal part 112 includes a plurality of input terminals 134 arranged in an end part area of the substrate 102.

The plurality of input terminals 134 included in the input terminal part 112 are respectively connected to the first drive circuits 118a, 118b and the second drive circuit 120 by the wiring 130. The input terminal 134 included in the input terminal part 112 is also connected to a first power supply line 126 and second power supply line 128 arranged in the display area 104. The input terminal 134 is electrically connected to a flexible wiring substrate 132. A video signal, a timing signal and drive power and the like are supplied to the input terminal part 112 from an external control circuit via the flexible wiring substrate 132.

In such a display device 100, at least one sealing layer is arranged on roughly the entire surface excluding the upper surface of the input terminal 134 in the input terminal part 112 including the display area 104 and the periphery area 106. The sealing layer is arranged as to cover the transistor 116 and the light emitting element 114 of the pixel 108. The roughly entire first surface of the substrate 102 is covered by this sealing layer. The sealing layer is formed by an insulating film. The sealing layer is formed including at least one inorganic insulating film. A silicon nitride film and a silicon oxide film or the like is applied as the inorganic insulating film.

The substrate 102 is formed by a member having flexibility. It is possible to use a resin substrate having flexibility, such as polyimide, polyethylene terephthalate, polyethylene naphthalate, triacetyl cellulose, a cyclic olefin copolymer, a cycloolefin polymer or other resin substrate having flexibility as a member forming the substrate 102.

By using such a substrate 102 having flexibility, it is possible to bend at least a part of an area of the display device 100. FIG. 1 shows a state before the substrate 102 is curved. For example, the substrate 102 can be curved at a first curved part 136a along a line Y1-Y2 in the diagram, a second curved part 136b along a line Y3-Y4, a third curved part 136c along a line X1-X2, and a fourth curved part 136d along a line X3-X4. The first curved part 136a to the fourth curved part 136d are areas along each edge of the rectangular substrate 102 and can be arranged in an arbitrary area further to the interior than an end part of the substrate 102. However, the curved part 136 is arranged in the periphery area 106 in order to reduce a substantial area of the so-called frame area.

Furthermore, although FIG. 1 shows a form in which four curved parts are arranged along each edge of the substrate 102, the present invention is not limited to this structure. According to one embodiment of the present invention, it is possible to arrange two curved parts along a first edge and a second edge intersecting the first edge of the substrate 102. For example, the first curved part 136a and the fourth curved part 136d may be arranged as one group of curved parts, and the second curved part 136b and the third curved part 136c may be arranged as one group of curved parts.

The display device 100 has an opening part 138 in which the sealing layer is removed in an area where a curved part along a first edge of the substrate 102 and a curved part along a second edge intersecting the first edge intersect each other. An example is shown in FIG. 1 in which a first opening part 138a is arranged in an area where the first curved part 136a and the third curved part 136c intersect and in an area where the second curved part 136b and the third curved part 136c intersect, and a third opening part 138c is arranged in an area where the first curved part 136a and the fourth curved part 136d intersect, and in an area where the second curved part 136b and the fourth curved part 136d intersect. The opening parts 138 (first opening part 138a, second opening part 138b, third opening part 138c, fourth opening part 138d) are arranged in an area inside from a corner part of the substrate 102 which is an area where the sealing layer is removed. It is preferred that the opening parts 138 (first opening part 138a, second opening part 138b, third opening part 138c, fourth opening part 138d) expose the first surface of the substrate 102 where the sealing layer is removed.

The first drive circuits 118a and 118b, the second drive circuit 120, the display area 104, and the wiring 130 connecting input terminal parts 112 are arranged in the periphery area 106. The wiring 130 arranged in the periphery area 106 is arranged so as not to overlap the opening part 138 in a planar view. In other words, a plurality of wires 130 arranged in the periphery area 106 are arranged in an area other than the opening part 138. For example, the wiring 130 is arranged in an area between the third opening part 138c and the end part of the substrate 102. In addition, wirings are also arranged in an area between the third opening part 138c and the display area 104.

Furthermore, in FIG. 1, an opening part or groove 166 is arranged in an area outside the display area 104. This opening part 166 is also called a moisture blocking area. Details of the opening part 166 are explained in the second embodiment. The opening part 166 is arranged between the display area 104 and the peripheray area 106. The opening part 138 arranged in the periphery area 106 is arranged further to the exterior than the opening part 166.

Figure 2:
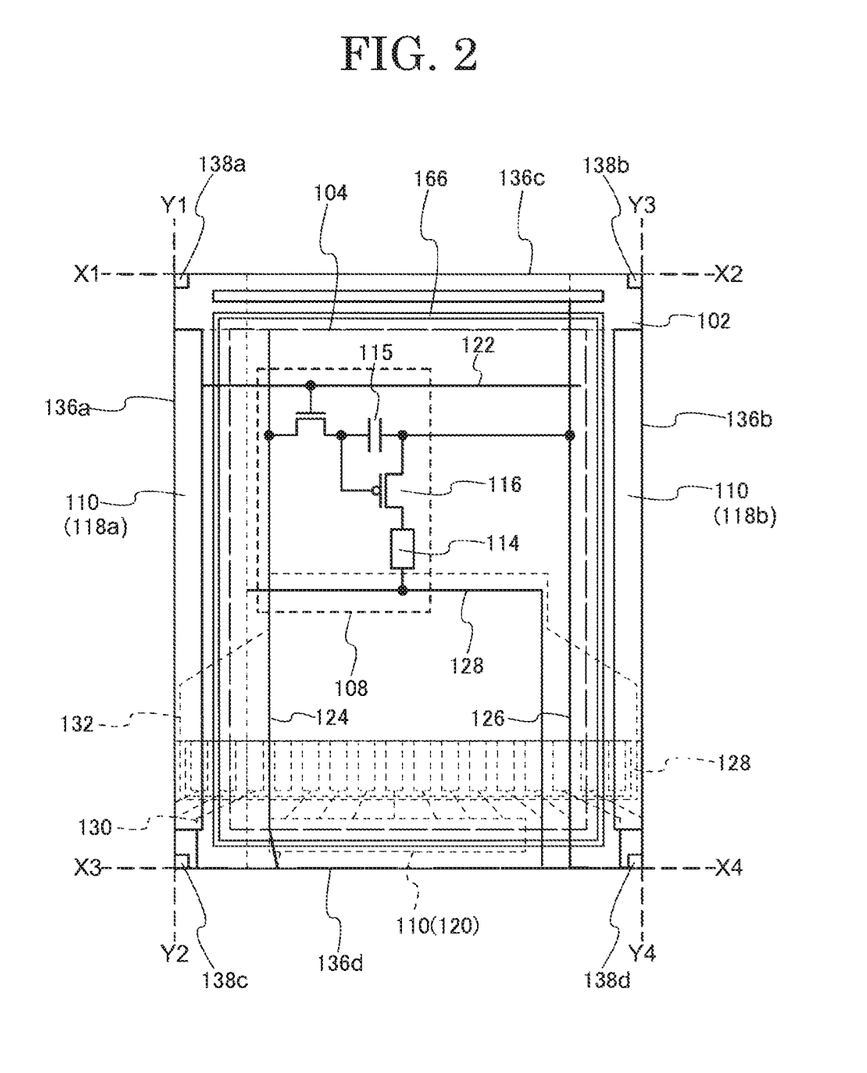
FIG. 2 is a planar view diagram showing a structure of a display device related to the present embodiment and shows a form in which a substrate is curved from the form shown in FIG. 1.

FIG. 2 shows a state in which the substrate 102 is bent toward the second surface side along the first curved part 136*a* and the fourth curved part 136*d*. An area where a curved part along a first edge of the substrate 102 and a curved part along a second edge intersect with each other causes the substrate 102 to be bent double. In a state in which the substrate 102 is bent, the opening parts 138 (first opening part 138*a*, second opening part 138*b*, third opening part 138*c*, fourth opening part 138*d*) are arranged at the end parts of the four edges.

A bending stress acts on a wiring or a sealing layer if they are arranged in an area where the substrate 102 is bent double. Specifically, a bending stress due to bending of the substrate 102 in one direction and bending stress due to bending in a direction crossing this first direction both act on the wiring and the sealing layer. In this case, wiring breakage becomes a problem. In addition, problems such as the occurrence of cracks and peeling of a film occur in the sealing layer. When cracks occur in this area in the sealing layer, the cracks eventually grow to the display area 104 which causes a light emitting element 114 to deteriorate.

However, in the display device 100 related to the present embodiment, by arranging the opening part 138 (first opening part 138*a*, second opening part 138*b*, third opening part 138*c*, fourth opening part 138*d*) is arranged in the substrate 102, it is possible to prevent such defects from occurring. That is, in the case where the substrate 102 is bent in two directions, by arranging the opening part 138 at the intersection of at least two directions, removing the sealing layer without arranging wiring in this part, it is possible to prevent bending stress from acting directly on these members.

Figure 3:
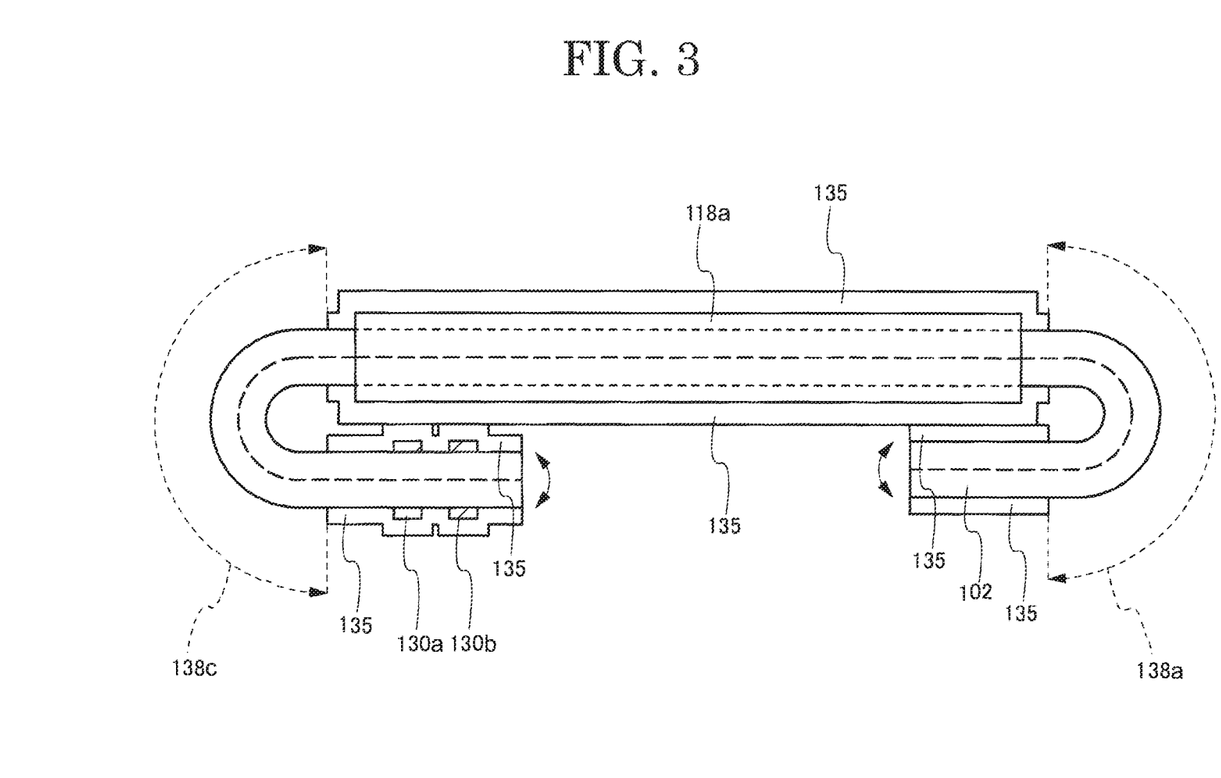
FIG. 3 is a cross-sectional diagram showing a structure of a display device related to the present embodiment and shows a form in which a substrate is curved from the form shown in FIG. 1.

FIG. 3 schematically shows a cross-sectional structure along the line Y1-Y2 shown in FIG. 2. FIG. 3 shows a form in which the first surface of the substrate 102 is bent at the first curved part 136*a* toward the second surface side and further bent at the third curved part 136*c* and fourth curved part 136*d*. The first curved part 136*a* is arranged so as to overlap with the first drive circuit 118*a* and the third curved part 136*c* and the fourth curved part 136*d* are arranged on the outer side of the first drive circuit 118*a* and the second drive circuit 120*b*. As a result, in the example shown in FIG. 3, a part of the first drive circuit 118*a* is bent.

A first opening part 138*a* is arranged in an area where the first curved part 136*a* and the third curved part 136*c* intersect, and a third opening part 138*c* is arranged in an area where the first curved part 136*a* and the fourth curved part 136*d* intersect. The first opening part 138*a* and the third opening part 138*c* are areas from which the sealing layer 135 is removed, and are areas in which the first surface of the substrate 102 is exposed. As a result, the first surface of the substrate 102 is exposed in the first opening part 138*a* and the third opening part 138*c*. In the first opening part 138*a* and the third opening part 138*c*, the substrate 102 is bent in two directions. However, as is shown in FIG. 3, a sealing layer 135 is removed from the first opening part 138*a* and the third opening part 138*c*, and the wiring 130 is not arranged. Therefore, bending stress due to bending the substrate 102 has a structure that does not act on the sealing layer 135 and the wiring 130.

In addition, as is shown in FIG. 2, when the substrate 102 is bent along the line Y1-Y2, the line Y3-Y4, the line X1-X2 and the line X3-X4, the first opening part 138*a*, the second opening part 138*b*, the third opening part 138*c* and the fourth opening part 138*d* are positioned at the four corners of the substrate 102 respectively. Since a sealing layer including an inorganic insulating film is removed in the first opening part 138*a*, the second opening part 138*b*, the third opening part 138*c* and the fourth opening part 138*d*, even if impact is applied to a corner part of the substrate 102 by dropping or the like, damage to a sealing layer can be prevented.

As described above, in the present embodiment, in the display device 100 having flexibility, by arranging the opening part 138 in an area where the curved part 136 which bends the substrate 102 intersects, it is possible to relieve stress applied to the wiring 130 and a sealing layer and prevent the occurrence of defects.

Second Embodiment

Figure 4:
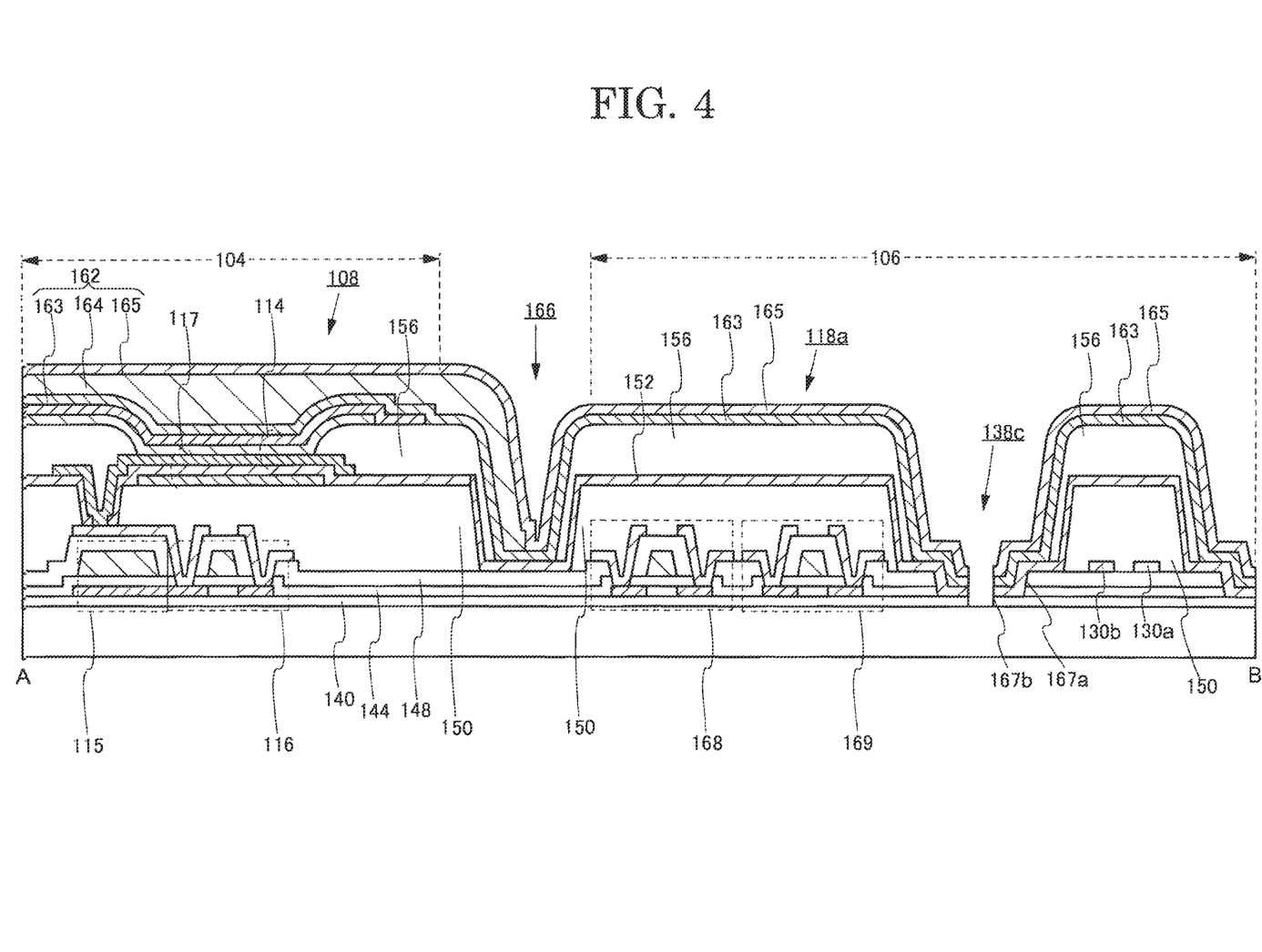
FIG. 4 is a cross-sectional diagram showing a structure of a display device related to the present embodiment.
Figure 5:
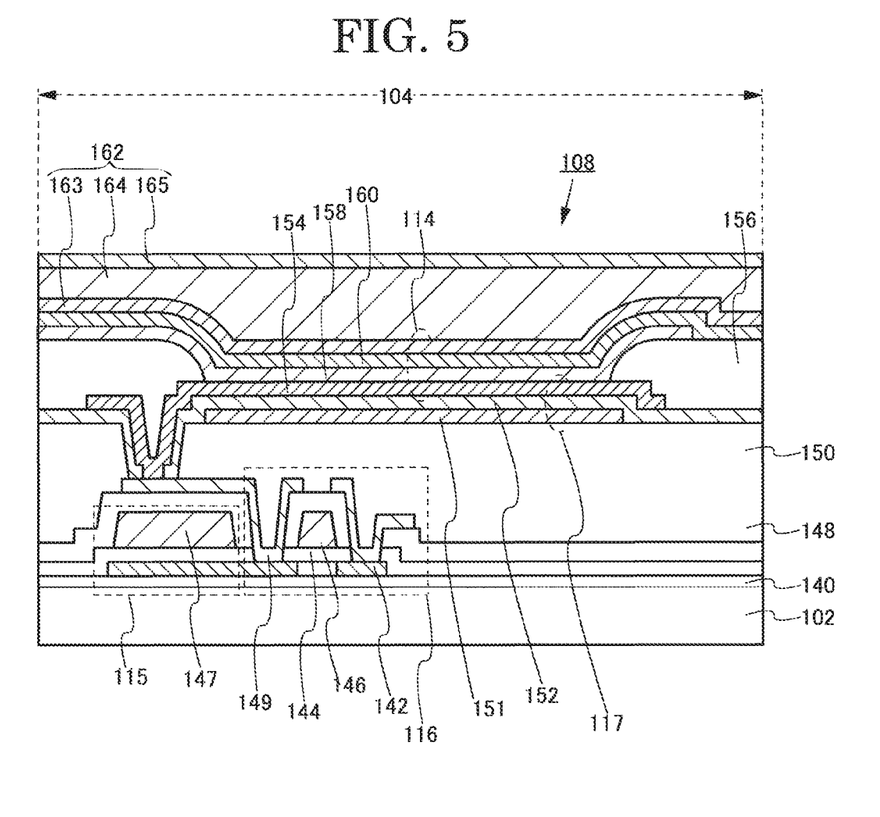
FIG. 5 is a cross-sectional diagram showing a structure of a display device related to the present embodiment.

Details of the display device 100 related to one embodiment of the present invention are explained while referring to the cross-sectional schematic view along line A-B in FIG. 1. FIG. 4 shows a cross-sectional view of the display device 100. In addition, FIG. 5 is a cross-sectional view for explaining the details of a pixel 108. In the following explanation, an explanation is made with reference to FIG. 4 and FIG. 5 as appropriate.

As is shown in FIG. 4, in the display device 100, the periphery area 106 and the display area 104 are arranged from an end of the substrate 102. In addition, an opening part or groove 166 is arranged between the display area 104 and the periphery area 106. A first drive circuit 118*a* is arranged in the periphery area 106. A third opening part 138*c* is arranged between the first drive circuit 118*a* and an end part of the substrate 102. Furthermore, wirings 130*a* and 130*b* are arranged between the third opening part 138*c* and an end part of the substrate 102.

The pixel 108 arranged in the display area 104 is formed including a transistor 116, light emitting element 114, first capacitor element 115 and a second capacitor element 117. The light emitting element 114 is electrically connected to the transistor 116. The transistor 116 has a function for controlling light emission of the light emitting element 114. The first capacitor element 115 holds a gate voltage of the transistor 116, the second capacitor element 117 operates to maintain the gate voltage of the transistor 116 and is arranged to suppressing fluctuation of a current flowing in the light emitting element 114.

A first insulating layer 140 is arranged on the first surface of the substrate 102, and the transistor 116 is arranged over the first insulating layer 140. The first insulating layer 140 is also called an underlying insulating layer and is formed from an inorganic insulating film having barrier properties against moisture and the like. The transistor 116 has a structure in which a semiconductor layer 142, second insulating layer 144 which functions as a gate insulating layer, and a gate electrode 146 are stacked. The semiconductor layer 142 is formed from amorphous or polycrystalline silicon or an oxide semiconductor layer and the like. A source-drain electrode 149 is connected to a source-drain area formed in the semiconductor layer 142. The source-drain electrode 149 is formed above a third insulating layer 148 arranged on an upper layer side of the second insulating layer 144. A fourth insulating layer 150 is arranged above the source-drain electrode 149 as a planarization layer. The fourth insulating layer 150 buries a step of an underlying surface formed by the source-drain electrode 149 and the like, and flattens a surface on which the light emitting element 114 is formed. While the second insulating layer 144 and the third insulating layer 148 are formed of an inorganic insulating film such as a silicon oxide film or a silicon nitride film, the fourth insulating layer 150 is formed of an organic insulating film such as an acrylic resin or a polyimide resin and the like. The first capacitor element 115 is formed in an area where the semiconductor layer 142, second insulating layer 144 and the first capacitor electrode 147 overlap.

A pixel electrode 154 is arranged on an upper layer side of the fourth insulating layer 150. The pixel electrode 154 is connected to the source-drain electrode 149 via a contact hole formed in the fourth insulating layer 150. A sixth insulating layer 156 which exposes the central part of the pixel electrode 154 and covers a periphery part is arranged on the upper layer side of the pixel electrode 154. The sixth insulating layer 156 is formed from an organic resin film the same as the fourth insulating layer 150. An organic layer 158 is arranged above the pixel electrode 154 and the sixth insulating layer 156. An opposing electrode 160 is arranged above the organic layer 158 and is arranged from the upper surface of the pixel electrode 154 to the upper surface part of the sixth insulating layer 156. The light emitting element 114 is formed in an area where the pixel electrode 154, organic layer 158 and the opposing electrode 160 overlap. The second capacitor element 117 is formed in an area where the pixel electrode 154, fifth insulating layer 152 and the second capacitor electrode 151 overlap.

Furthermore, the organic layer 158 is a layer including a light emitting material such as an organic electroluminescent material, and is formed using a low molecular or high molecular organic material. The organic layer 158 is formed from, for example, a low molecular organic material. The organic layer 158 includes, in addition to the light emitting layer, a carrier injection layer such as a hole injection layer and an electron injection layer, a carrier transport layer such as a hole transport layer and an electron transport layer, and a carrier block layer such as a hole blocking layer and an electron block layer. One of the pixel electrode 154 and the opposing electrode 160 serves as an anode and the other serves as a cathode. The anode is a layer contacting the hole injection layer, and a conductive material having a high work function such as indium tin oxide (also called ITO) is used. The cathode is formed of a conductive material including an alkali metal or an alkaline earth metal as a layer contacting the electron injection layer. Since the organic layer 158 deteriorates due to moisture, a sealing layer is required in an upper layer of the light emitting element 114.

A seventh insulating layer 162 is arranged above the light emitting element 114 as a sealing layer. The seventh insulating layer 162 covers the light emitting element 114 and is arranged to prevent moisture or the like from entering the organic layer 158. The seventh insulating layer 162 has a stacked structure of a first inorganic insulating layer 163, an organic insulating layer 164 and a second inorganic insulating layer 165. The first inorganic insulating layer 163 and the second inorganic insulating layer 165 are formed from an inorganic insulating material such as silicon nitride or aluminum oxide and the like. The organic insulating layer 164 is formed from an organic insulating material such as a polyimide resin, acrylic resin or an epoxy resin and the like. By arranging the organic insulating layer 164 above the first inorganic insulating layer 163 in the seventh insulating layer 162, even if defects are generated in the first inorganic insulating layer 163 due to foreign objects becoming attached on the opposing electrode 160, the organic insulating layer 164 fills the defect parts and by further arranging the second inorganic insulating layer 165, a structure is adopted which increases barrier properties against moisture or the like.

As is shown in FIG. 4, the first drive circuit 118a is arranged adjacent to the display area 104 where a pixel 108 is arranged. FIG. 4 shows a form in which an n-channel transistor 168 and a p-channel transistor 169 are arranged in the first drive circuit 118a. The first insulating layer 140, the second insulating layer 144, the third insulating layer 148, the fourth insulating layer 150, the fifth insulating layer 152 and the sixth insulating layer 156 are similarly arranged in an area where the first drive circuit 118a is formed.

Furthermore, the fourth insulating layer 150 formed from an organic insulating material is arranged with an opening part or groove 166 between the display area 104 and an area where the first drive circuit 118a is arranged. The opening part 166 passes through the fourth insulating layer 150 and exposes the third insulating layer 148 formed from an inorganic insulating material. With respect to the opening part 166, the fifth insulating layer 152 is arranged covering a side surface of the opening part 166 and an upper surface of the third insulating layer 148 which is the bottom surface of the opening part 166 from an upper surface of the fourth insulating layer 150. As is shown in FIG. 1, the opening part 166 is arranged so as to enclose the display area 104. In addition, the opening part 166 divides the fourth insulating layer 150 into a display area 104 side and a periphery area 106 side. The sixth insulating layer 156 formed from an organic insulating material is also similarly divided into a display area 104 side and a peripheral area 106 side where the first drive circuit 118a is arranged in the opening part 166. The first inorganic insulating layer 163 of the seventh insulating layer 162 is arranged covering the opposing electrode 160 and the sixth insulating layer 156 and covers the opening part 166. On the other hand, although the organic insulating layer 164 is arranged on roughly the entire surface of the display area 104, it is arranged so that an end part does not reach the periphery area 106 beyond the opening part 166. The second inorganic insulating layer 165 covers an upper surface and an end surface of the organic insulating layer 164 and is arranged to contact with the first inorganic insulating layer 163 from a bottom surface of the opening part 166 to the periphery area 106.

Beginning with a fifth inorganic insulating layer 152 formed from an inorganic insulating material, a first inorganic insulating layer 163 and a second inorganic insulating layer 165 extend to the opening part 166 from which the fourth insulating layer 150 is removed. The bottom surface of the opening part 166 has a structure in which the fifth insulating layer 152, the first inorganic insulating layer 163 and the second inorganic insulating layer 165 are stacked above the third insulating layer 148. By sandwiching the fourth insulating layer 150 and the sixth insulating layer 156 formed from an organic resin material between the insulating layers formed from an inorganic insulating material, the entrance of moisture from the periphery area 106 to the display area 104 is prevented. An area where the opening 166 part is arranged can also be called a "moisture blocking area" or a "moisture blocking structure" since it prevents moisture from entering the light emitting element 114.

In the peripheral area 106, a third opening part 138c is arranged in an area on the outer side of the first drive circuit 118a. End parts of the fourth insulating layer 150 and the sixth insulating layer 156 arranged in an area of the first drive circuit 118a are respectively arranged in an area which does not reach the third opening part 138c. The first insulating layer 140, second insulating layer 144, third insulating layer 148, fifth insulating layer 152, first inorganic insulating layer 163 and second inorganic insulating layer 165 extend to an area where the third opening part 138c is arranged. In this case, the fifth insulating layer 152 covers an end part of the fourth insulating layer 150, and the first inorganic insulating layer 163 is arranged to cover an end part of the sixth insulating layer 156. These insulating layers are removed and the first surface of the substrate 102 is exposed in the third opening part 138c.

In the form of the periphery area 106, by arranging the third opening part 138c in an area on the outer side of the opening part 166 functioning as a moisture blocking area, it is possible to prevent the entrance of moisture into the display area 104 even if a through hole exposing the first surface of the substrate 102 is arranged. That is, in the third opening part 138c, even if the first inorganic insulating layer 163 and the second inorganic insulating layer 165 functioning as a sealing layer are removed and a through hole is arranged to expose the first surface of the substrate 102, it is possible to block the entrance of moisture into the display area 104 by the moisture blocking structure formed in the opening part 166.

Furthermore, a more detailed example of the third opening part 138c includes a through hole 167b which passes through a stacked body of the first insulating layer 140, fifth insulating layer 152, first inorganic insulating layer 163 and the second inorganic insulating layer 165 formed of a silicon nitride film, and a through hole 167a which passes through a stacked body of the second insulating layer 144 and the third insulating layer 148 formed of a silicon oxide film. Among these, an opening end of the through hole 167b is arranged further to the interior than an opening end of the through hole 167a. In other words, by providing the through hole 167b formed in a silicon nitride film in the inner side of the through hole 167a formed in the silicon oxide film so as to cover an opening side surface of the silicon oxide film with the silicon nitride film, it is possible to more effectively prevent moisture from entering the periphery area 106 and the display area 104. The two through holes can be manufactured by utilizing the difference in etching rates between the silicon oxide film and the silicon nitride film.

In either case, even if an inorganic insulating layer is removed in the third opening part 138c and the first surface of the substrate 102 is exposed so that the substrate 102 is bent in two directions making this part a corner part, strong bending stress does not act on the first insulating layer 140, second insulating layer 144, third insulating layer, fifth insulating layer 152, first inorganic insulating layer 163 and the second inorganic insulating layer 165 which extend from the display area 104 and it is possible to prevent the occurrence of cracks and peeling of a film.

The first insulating layer 140, second insulating layer 144, third insulating layer, fourth insulating layer 150, fifth insulating layer 152, first inorganic insulating layer 163 and the second inorganic insulating layer 165 can be arranged in an area between the third opening part 138c and an end part of the substrate 102 the same as first drive circuit 118a. As a result, wirings 130a and 130b can also be arranged in this area. That is, by arranging the third opening part 138c at a position away from an end part of the substrate 102, it is possible to effectively utilize the area between the third opening part 138c and the end part of the substrate 102 as a wiring routing area.

Although FIG. 4 explains the third opening 138c, other opening parts (first opening part 138a, second opening part 138b, fourth opening part 138d) have the same structure and exhibit the same operation and effects.

According to the present embodiment, in the flexible display device 100, by providing the opening part 138 passing through an inorganic insulating layer in an area where the curved part 136 which bends the substrate 102 intersects, it is possible to relieve stress applied to the wiring 130 and the sealing layer and it is possible to prevent the occurrence of defects.

Modified Example 1

Figure 6A:
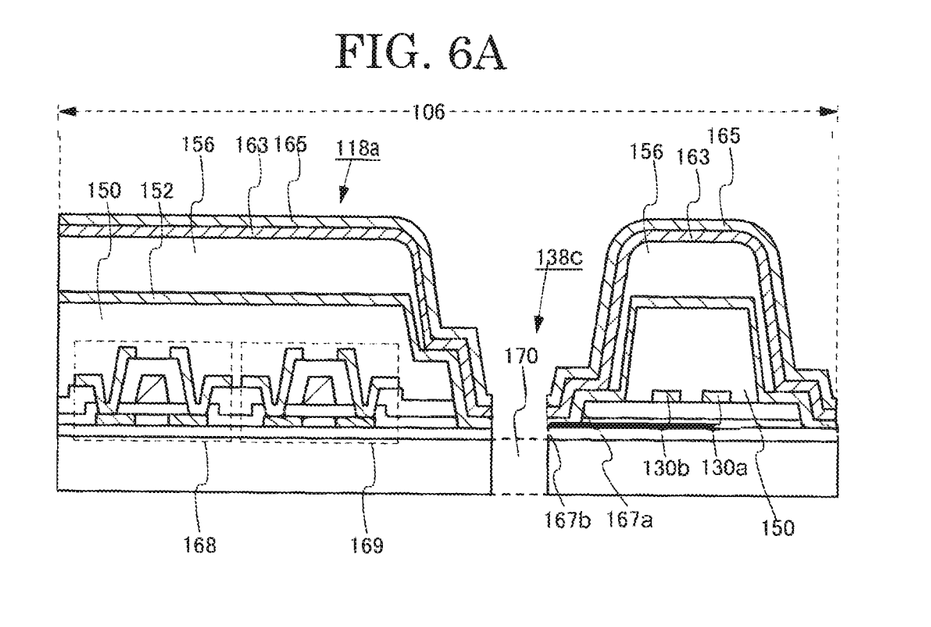
FIG. 6A and FIG. 6B are cross-sectional diagrams showing a structure of a display device related to the present embodiment.
Figure 6B:
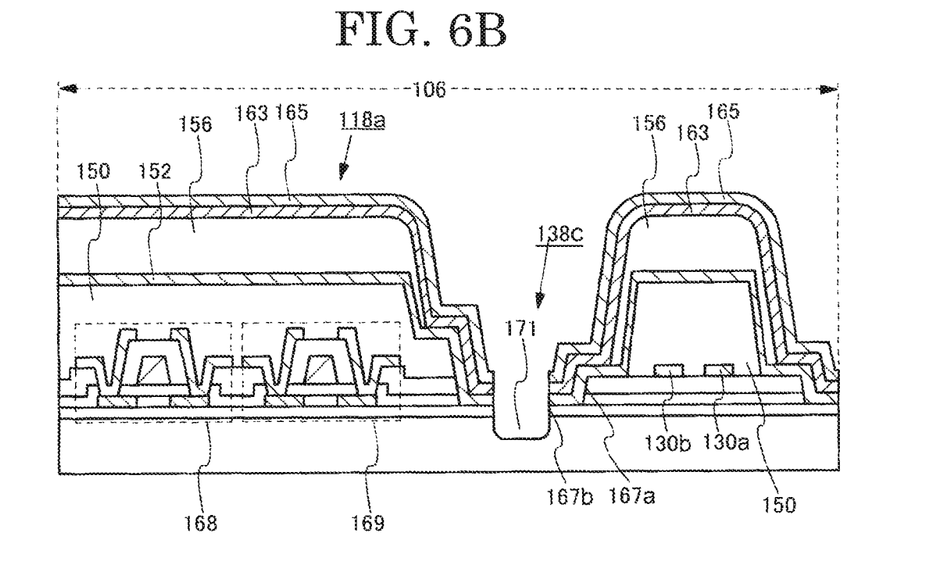

As another form of the opening part 138 (first opening part 138a, second opening part 138b, third opening part 138c, fourth opening part 138d) arranged in the periphery area 106, as is shown in FIG. 6A, a through hole 170 may be arranged passing through the substrate 102. By adopting such a structure, even if the substrate 102 is bent along a first edge and a second edge which intersects the first edge, since the substrate 102 does not have a double folding area, the substrate itself becomes easy to bend. In addition, as is shown in FIG. 6B, a bottomed hole 171 in which the substrate 102 has been trimmed so as to overlap with the opening part 138 (first opening part 138a, second opening part 138b, third opening part 138c, fourth opening part 138d) may be arranged. In this case, the substrate 102 is thinned and therefore the substrate can be easily bent.

Modified Example 2

Figure 7:
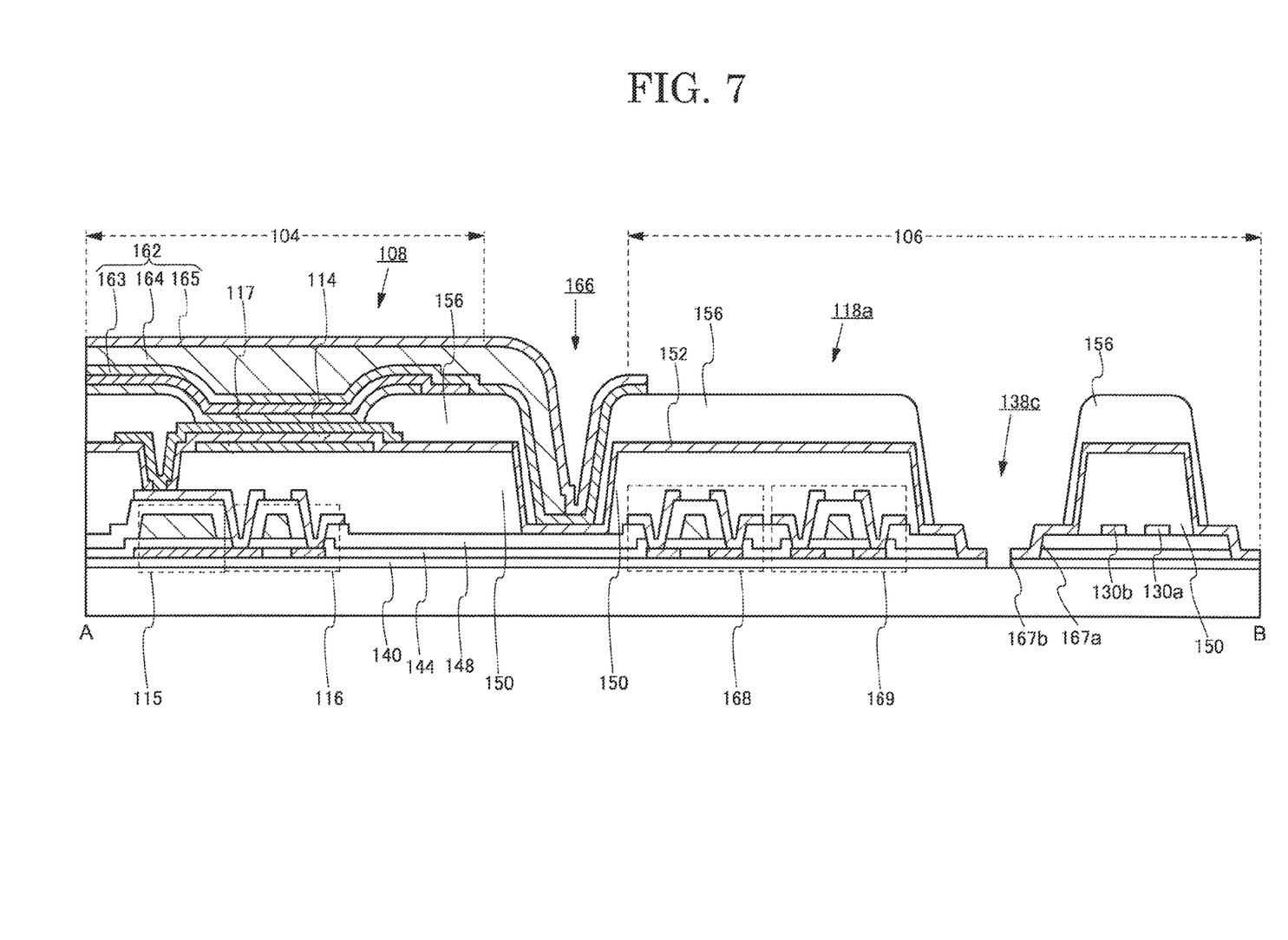
FIG. 7 is a cross-sectional diagram showing a structure of a display device related to the present embodiment.

In the periphery area 106, a part of an inorganic insulating film arranged in an area of the first drive circuit 118a may be removed. FIG. 7 shows a form in which the first inorganic insulating layer 163 and the second inorganic insulating layer 165 arranged above the sixth insulating layer 156 are removed. In the case when the first curved part 136a overlaps an area of the first drive circuit 118a as is shown in FIG. 1, by removing the inorganic insulating layer, it is possible to ensure that stress due to bending of the substrate 102 does not act on other areas of the inorganic insulating layer. That is, it is possible to prevent any stress caused by bending of the substrate 102 from acting on the first inorganic insulating layer 163 and the second inorganic insulating layer 165 arranged as a part of a sealing layer. In this way, it is possible to protect the seventh insulating layer 162 as a sealing layer arranged in the display area 104. Although FIG. 7 shows a form in which the first inorganic insulating layer 163 and the second inorganic insulating layer 165 are removed in the periphery area 106, the present invention is not limited to this form, and only the area above the first drive circuit 118a may be selectively removed.

Third Embodiment

Figure 8:
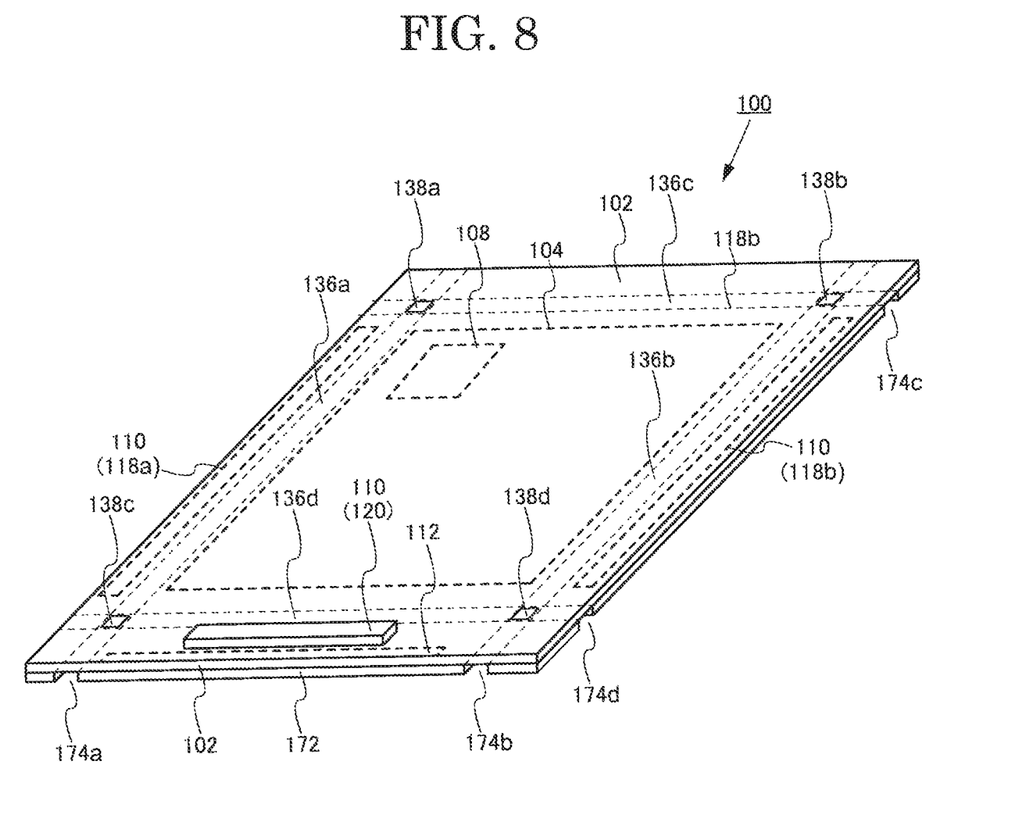
FIG. 8 is a perspective view diagram showing a structure of a display device related to the present embodiment.

FIG. 8 shows a form in which a support member 172 is arranged on the second surface side of the substrate 102 in the display device 100. The support member 172 has a plate shape and has elasticity. By arranging such a support member 172 in close contact with the substrate 102, it is possible to achieve substantial thickening of a substrate while maintaining flexibility. It is preferred that the support member 172 is arranged with a notch part 174 corresponding to the curved part 136. By providing the notch part 174 in the support member 172, it is possible to define a curved part since a part of the substrate thereof is substantially thinned compared with other areas. It is possible to arrange the notch part 174 in a direction along a first edge of the substrate 102 and a direction intersecting the first edge.

By arranging the opening part 138 in an area where a notch part 174a along a first edge and a notch part 174b along a direction intersecting the first edge intersect with each other, the same effects as in the first embodiment and the second embodiment are obtained and it is possible to improve reliability of the display device 100 having flexibility.

What is claimed is:

1. A display device comprising:
   a substrate having flexibility and including a first surface and a second surface opposing the first surface, and an outer edge;
   a display area on the first surface of the substrate and including a plurality of pixels;
   a periphery area on an outer side of the display area on the first surface; and
   a sealing layer covering the display area and the periphery area, wherein
   the display area and the periphery area comprise a first elements layer and a second elements layer, wherein, within the display area, the first elements layer includes a first plurality of transistors and the second elements layer includes a plurality of light emitting elements and one or more insulating layers, and within the periphery area, the first elements layer includes a second plurality of transistors and the second elements layer includes at least one or the one or more insulating layers, and the second elements layer is arranged on the first elements layer,
   a groove passes through the first and second elements layers between the display area and the periphery area,
   the sealing layer includes a first part that covers the first and second elements layers and a second part that runs through the groove and covers opposing edges of the first and second elements layers formed by the groove,
   the periphery area includes a wiring part, wherein the first elements layer, the second elements layer and the sealing layer are arranged, the periphery area includes first opening part through the first and second elements layers, and the periphery area includes a second opening which penetrates the substrate and is arranged directly below the first opening part, and
   a part of the wiring part, the first opening part, the second part of the sealing layer and the display area are arranged in a sequential order from the outer edge of the substrate.

2. The display device according to claim 1, wherein at least a first part of the wiring part is arranged between a corner part of the substrate and the first opening part.

3. The display device according to claim 2, wherein at least a second part of the wiring part is arranged between the first opening part and the display area.

4. The display device according to claim 1, wherein the first opening part comprises a plurality of opening parts, the substrate includes a plurality of corner parts, and the plurality of opening parts are respectively arranged corresponding to the plurality of corner parts of the substrate.

5. The display device according to claim 1, wherein the substrate includes a first curved part along a first side of the substrate and a second curved part along a second side different from the first side of the substrate, and the first opening part overlaps an intersection part between the first curved part and the second curved part.

6. The display device according to claim 1, further comprising:
   a support member on the second surface of the substrate, wherein
   the support member includes a first notch part along a first side of the substrate and a second notch part along a second side intersecting the first side of the substrate, and
   the first opening part is arranged in an area where the first notch part and the second notch part intersect.

7. The display device according to claim 1, wherein:
   within the display area, the sealing layer includes a first inorganic insulating layer, a second inorganic insulating layer, and an organic insulating layer between the first inorganic insulating layer and the second inorganic insulating layer;
   within the display area and the periphery area, the first elements layer includes a plurality of inorganic insulating layers comprising an inorganic insulating material, a plurality of conducting layers comprising a conducting material, and a planarization layer comprising an organic insulating material on the plurality of inorganic insulating layers;
   within the display area, the second elements layer includes an anode, a bank layer comprising an organic insulating material, an organic layer comprising an organic electroluminescent material, and a cathode;
   the first opening part includes a first opening provided in the plurality of inorganic insulating layers and the plurality of conducting layers, a second opening provided in the planarization layer, and a third opening provided in the bank layer; and
   a width of the first opening is smaller than a width of the second opening and the width of the first opening is smaller than a width of the third opening.

8. The display device according to claim 7, wherein:
   the first opening part comprises a plurality of opening parts;
   the sealing layer includes a region surrounding the plurality of opening parts and a region where the first inorganic insulating layer and the second inorganic insulating layer are in contact with each other in the groove, and the second part of the sealing layer surrounds the display area.

9. The display device according to claim 8, wherein the periphery area includes a drive circuit configured to output a video signal to the display area and a video signal line extending from the drive circuit to the display area, and two of the plurality of openings are arranged to sandwich the video signal line.

10. A display device comprising:
    a substrate including a first surface and a second surface opposing the first surface;
    a display area on the first surface of the substrate, the display area including a plurality of pixels;
    a periphery area on the first surface of the substrate, the periphery area arranged at an outer side of the display area; and
    a sealing layer covering the display area and the periphery area, wherein
    the periphery area includes a drive circuit configured to output a signal to the display area,
    an input terminal part configured for input of a signal for driving the drive circuit, and a plurality of wirings arranged between the drive circuit and the input terminal part, and
    the sealing layer includes a plurality of first opening parts through the sealing layer,
    the substrate includes a plurality of second opening parts which penetrate the substrate and are arranged directly below the plurality of the first opening parts, and
    the display area has a plurality of corner parts, and the plurality of the first opening parts are respectively arranged corresponding to the plurality of corner parts of the display area.

11. The display device according to claim 10, wherein the substrate is flexible.

12. The display device according to claim 10, wherein at least a part of the plurality of wirings is arranged between a corner part of the substrate and at least one of the plurality of the first opening parts.

13. The display device according to claim 12, wherein at least a part of the plurality of wirings is arranged between at least one of the plurality of the first opening parts and at least one of the plurality of corner parts of the display area.

14. The display device according to claim 10, wherein the substrate has a plurality of corner parts, and the plurality of the first opening parts are respectively arranged corresponding to the plurality of corner parts of the substrate.

15. The display device according to claim 10, wherein the substrate includes a first curved part along a first side of the substrate and a second curved part along a second side of the substrate different from the first side of the substrate, and at least one of the plurality of the first opening parts overlaps an intersection part between the first curved part and the second curved part.

16. The display device according to claim 10, wherein the sealing layer includes a first inorganic insulating layer and a second inorganic insulating layer.

17. The display device according to claim 16, wherein:
each of the plurality of pixels includes a first transistor and a light emitting element electrically connected to the first transistor;
the drive circuit includes a second transistor and a third transistor;
the display area and the periphery area include at least a first insulating layer arranged on the first surface of the substrate, a second insulating layer as a gate insulating layer of the first transistor, the second transistor and the third transistor, and a third insulating layer arranged between the first transistor and the light emitting element; and
each of the plurality of the first opening parts includes a first through hole through a first stacked layer body including the second insulating layer and the third insulating layer, and a second through hole through a second stacked layer body including at least the first insulating layer and the second insulating layer, and an opening end of the second through hole is arranged on an inner side of an opening end of the first through hole.

18. The display device according to claim 10, further comprising:
a support member on the second surface of the substrate; wherein
the support member includes a first notch part along a first side of the substrate and a second notch part along a second side intersecting the first side of the substrate, and
each of the plurality of the first opening parts is arranged in an area where the first notch part and the second notch part intersect.

* * * * *